ndependent (12) United States Patent
Haag et al.

(10) Patent No.: US 9,885,626 B2
(45) Date of Patent: Feb. 6, 2018

(54) MICROMECHANICAL SENSOR SYSTEM AND CORRESPONDING MANUFACTURING METHOD

(71) Applicants: Timo Benzel, Kusterdingen (DE); Robert Bosch GmbH, Stuttgart (DE)

(72) Inventors: Frieder Haag, Wannweil (DE); Hubert Benzel, Pliezhausen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 367 days.

(21) Appl. No.: 14/472,167

(22) Filed: Aug. 28, 2014

(65) Prior Publication Data

US 2015/0059485 A1 Mar. 5, 2015

(30) Foreign Application Priority Data

Aug. 30, 2013 (DE) .................. 10 2013 217 349

(51) Int. Cl.
| | |
|---|---|
| *G01L 9/00* | (2006.01) |
| *B81B 3/00* | (2006.01) |
| *B81B 7/02* | (2006.01) |
| *B81C 1/00* | (2006.01) |
| *B81B 7/00* | (2006.01) |
| *G01L 19/14* | (2006.01) |

(52) U.S. Cl.
CPC .......... *G01L 9/0052* (2013.01); *B81B 3/0021* (2013.01); *B81B 7/007* (2013.01); *B81B 7/02* (2013.01); *B81C 1/00373* (2013.01); *G01L 9/0047* (2013.01); *G01L 19/148* (2013.01); *B81B 2201/0264* (2013.01); *B81B 2207/092* (2013.01); *B81C 2203/0154* (2013.01); *H01L 2224/48091* (2013.01); *H01L 2224/49171* (2013.01)

(58) Field of Classification Search
CPC ............................ G01L 9/0052; B81B 3/0021
USPC ........................................................... 73/725
See application file for complete search history.

(56) References Cited

U.S. PATENT DOCUMENTS

| | | | | |
|---|---|---|---|---|
| 4,665,754 | A  * | 5/1987 | Glenn | ................... G01L 9/0054 29/621.1 |
| 2009/0071259 | A1* | 3/2009 | Tanaka | .................. G01L 9/0042 73/725 |

(Continued)

FOREIGN PATENT DOCUMENTS

DE    10 2004 036 032    7/2005

OTHER PUBLICATIONS

M. Brunnbauer et al., "An embedded device technology based on a molded reconfigured wafer" in Proc. of Electronic Components and Technology Conference, US 2006, pp. 547-551.

*Primary Examiner* — David M Gray
*Assistant Examiner* — Andrew V Do
(74) *Attorney, Agent, or Firm* — Norton Rose Fulbright US LLP; Gerard Messina (57) ABSTRACT

A micromechanical sensor system includes a micromechanical sensor chip surrounded at least laterally by a molded housing which has a front side and a rear side. The micromechanical sensor chip includes a chip area on the rear side, which is omitted from the molded housing, and a rewiring device formed on the rear side, which, starting from the chip area, extends to the surrounding molded housing on the rear side, and from there, past at least one via from the rear side to the front side of the molded housing.

17 Claims, 8 Drawing Sheets

(56) References Cited

U.S. PATENT DOCUMENTS

| | | | |
|---|---|---|---|
| 2011/0133315 A1* | 6/2011 | Pahl | B81B 7/0048 257/659 |
| 2013/0152696 A1* | 6/2013 | Kalz | B81B 7/02 73/777 |
| 2014/0264909 A1* | 9/2014 | Liu | B81C 1/00301 257/774 |

* cited by examiner

MICROMECHANICAL SENSOR SYSTEM AND CORRESPONDING MANUFACTURING METHOD

BACKGROUND OF THE INVENTION

1. Field of the Invention

The present invention relates to a micromechanical sensor system and a corresponding manufacturing method.

2. Description of the Related Art

A method for manufacturing a diaphragm sensor for absolute pressure measurement or differential pressure measurement is known from published German patent application document DE 10 2004 036 032 A1.

More recently, so-called mold wafer packages are frequently used in semiconductor technology, in which individual semiconductor chips are embedded spaced apart from one another in a molding compound, the molding compound itself having the shape of a wafer and the semiconductor chips, for example, are inserted on a surface of the molding compound where they are exposed. An overview is found, for example, in M. Brunnbauer et al., "An embedded device technology based on a molded reconfigured wafer" in Proc. of Electronic Components and Technology Conference, US 2006, pages 547-551.

During manufacture, the chips are positioned on a carrier and subsequently molded with the housing plastic material, the molding compound, after which a rewiring is provided in the area of the exposed chip surface.

BRIEF SUMMARY OF THE INVENTION

Although applicable in principle to any micromechanical sensor system, the present invention and the underlying problem are explained with respect to micromechanical absolute pressure sensor systems or differential pressure sensor systems.

The present invention is based on the idea that vias are formed in the molding compound during the molding process. For example, connector pins may be positioned on the carrier, which later represent the via. These may be metal pins or semiconductor pins, for example. After the carrier is removed, the semiconductor chips and the connector pins become exposed and may be electrically contacted via a rewiring device. One advantage in the case of the micromechanical sensor system according to the present invention is that the electrical contacting may be transferred by way of the vias to the rear side of the sensor, where no medium is present. In other words, a separation takes place between the exposed sensor detection area, for example, the diaphragm area, and the electrical contact side.

The rewiring is preferably initiated by applying an isolation layer, which is opened in the area of the vias on the chips and the connector pins. The rewiring may be produced, for example, with the aid of a screen printing method or a thin film technique, a mask layer and then a conductive layer being initially applied.

The present invention makes it possible to manufacture micromechanical sensor systems, the front side of the chips of which are all electrically contacted via the rewiring and the connector pins using the mold wafer level package (mWLP) method. After separation, for example by sawing, the sensors may be bonded together with other components in the target housing, for example, a carrier in the form of a ceramic plate or a printed circuit board.

The bond itself may be applied using various methods. Here, the screen printing method or pad printing, among others, is also possible, since the adhesive is advantageously intended to be also applied to the area of the exposed electrical leads. The application of the adhesive layer on the chip plane may also particularly advantageously take place at the wafer level.

Thus, the present invention permits a robust and cost-efficient packaging of micromechanical sensor systems, in particular absolute pressure or differential pressure sensor systems, using one single packaging technology. A media-resistant design resulting from a media-resistant adhesive over the conducting paths is possible.

The packaging technology permits the provision of one or more separate ASICs in the same housing.

According to one preferred specific embodiment, the micromechanical sensor chip is affixed on the rear side or the front side to a carrier substrate. This makes a stable design possible.

According to another preferred specific embodiment, an isolation layer is provided on the rear side, on and/or in which the rewiring device is formed. This makes it possible for the rewiring device to be well connected.

According to another preferred specific embodiment, stress relief trenches are formed in the molded housing, starting from the front side and/or the rear side in the periphery of the micromechanical sensor chip. The stress relief trenches ensure an effective relief of stress of the housing and the sensor chip. It is advantageous, in particular in the case of printed circuit board materials having high temperature expansion coefficients, for at least one stress relief trench to be incorporated in the molded housing.

According to another preferred specific embodiment, the chip area includes a diaphragm area. According to the present invention, this diaphragm area may be decoupled from the rewiring area, so that any aggressive media are unable to affect the rewiring area.

According to another preferred specific embodiment, the chip area includes one or multiple connecting pads. These are used as starting points for the rewiring device and may also be media-resistantly packaged.

According to another preferred specific embodiment, the rewiring device is covered with a cover layer, in particular an adhesive layer. Such an adhesive layer may fulfill a double function for attachment and packaging.

According to another preferred specific embodiment, the micromechanical sensor chip is a differential pressure sensor chip or an absolute pressure sensor chip.

According to another preferred specific embodiment, an evaluation chip is provided in the molded housing, which is electrically connected at the rear side thereof to the via by way of the rewiring device. The degree of integration may be enhanced in this way.

According to another preferred specific embodiment, the via is formed in such a way that for the purpose of molding, a carrier is provided, on which connector pins are situated, which form the vias after the molding and removal of the carrier.

According to another preferred specific embodiment, the connector pins are connected during molding in a frame configuration to the front side via connecting webs, and the connecting webs are removed at the front side after molding. The connector pins are cost-efficiently introduced, in particular process friendly, if the connector pins are connected via connecting webs in a frame configuration or in a net-like manner prior to the molding process.

According to another preferred specific embodiment, the removal takes place using a grinding process.

According to another preferred specific embodiment, the via is formed in such a way that for the purpose of molding, a carrier is provided on which thermally or chemically removable sacrificial pins or mechanically removable stamp pins are situated, which are removed after molding and after removal of the carrier, after which the vias are formed by an application process for a conductive material in corresponding feed-throughs.

According to another preferred specific embodiment, the application process for a conductive material is a screen printing process or thin film deposition process.

DETAILED DESCRIPTION OF THE INVENTION

Identical reference numerals in the figures indicate identical or functionally identical elements.

FIGS. 1a through 1d are schematic, vertical, cross-sectional representations of a micromechanical sensor system according to a first through a fourth specific embodiment of the present invention.

Reference numeral 1 in FIGS. 1a through 1d indicates a carrier substrate made of ceramic, which includes a through-opening 100.

Figure 1A:
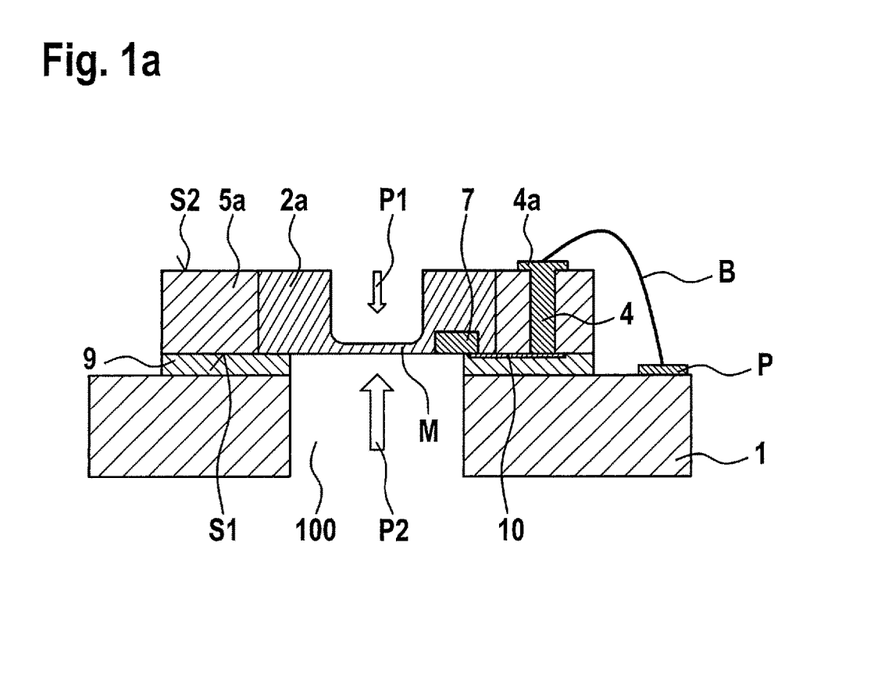
FIGS. 1a through 1d schematically show vertical, cross-sectional representations of a micromechanical sensor system according to a first through a fourth specific embodiment of the present invention.

According to FIG. 1a, a micromechanical differential pressure sensor chip 2a is laterally encapsulated with a molded housing 5a made of a plastic molding compound.

The chip includes a diaphragm area M, where pressures P1, P2 may act from different sides on diaphragm area M, thus making it possible to determine corresponding differential pressures P1, P2. The chip also includes an optional integrated evaluation circuit 7.

The chip area surrounding the diaphragm area is not covered by molded housing 5a. From the chip area, a rewiring device 10 having conducting paths on front side S1 facing carrier substrate 1 of molded differential pressure sensor chip 2a extends to surrounding molded housing 5a.

Reference numeral 4 indicates a pin-like via from front side S1 to rear side S2 in molded housing 5a. Packaged differential pressure sensor chip 2a is bonded to carrier substrate 1 by an adhesive layer 9, adhesive layer 9 functioning at the same time as an isolating cover layer in the area of rewiring device 10. Differential pressure sensor chip 2a is affixed above through-opening 100 in such a way that diaphragm area M is located above through-opening 100.

A bonding surface 4a is provided on rear side S2 of differential pressure sensor chip 2a, which is in electrical contact with via 4. Differential pressure sensor chip 2a, starting from bonding surface 4a, is connected by a bonding wire B to an electrical connection surface P on carrier substrate 1.

Figure 1B:
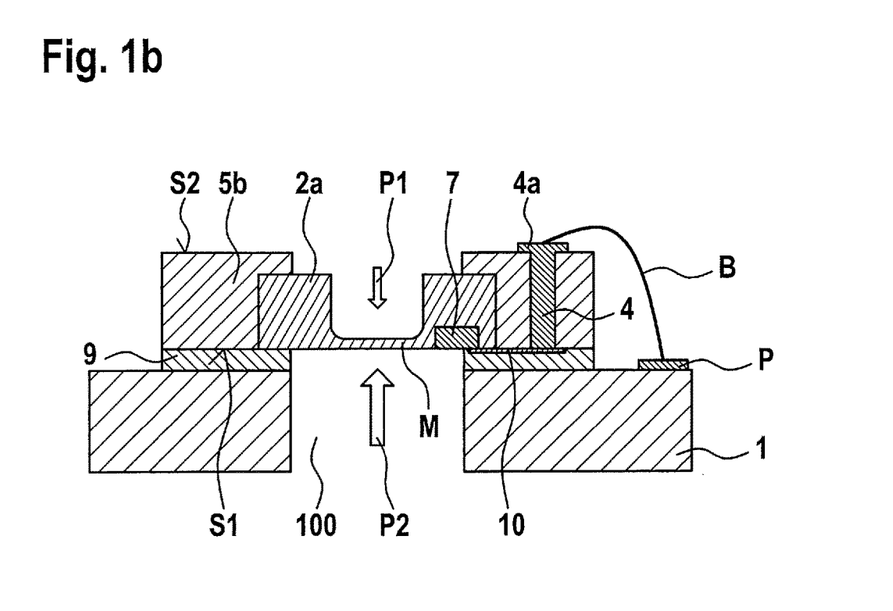

According to FIG. 1b, molded housing 5b not only extends next to differential pressure sensor chip 2a, but extends higher at rear side S2 than differential pressure sensor chip 2a and also partially covers the side of differential pressure sensor chip 2a opposite diaphragm area M. The structure is otherwise the same as in FIG. 1a.

Figure 1C:
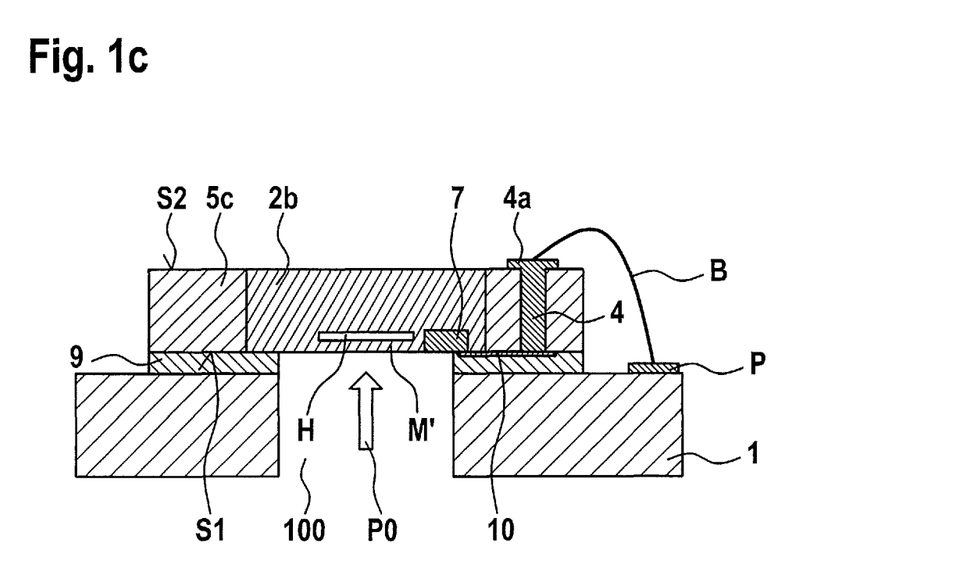

According to FIG. 1c, an absolute pressure sensor chip 2b laterally surrounded by molded housing 5c is provided instead of differential pressure sensor chip 2a, which also includes a diaphragm area M' and an underlying hollow space H. The structure is otherwise the same as in FIG. 1a.

Figure 1D:
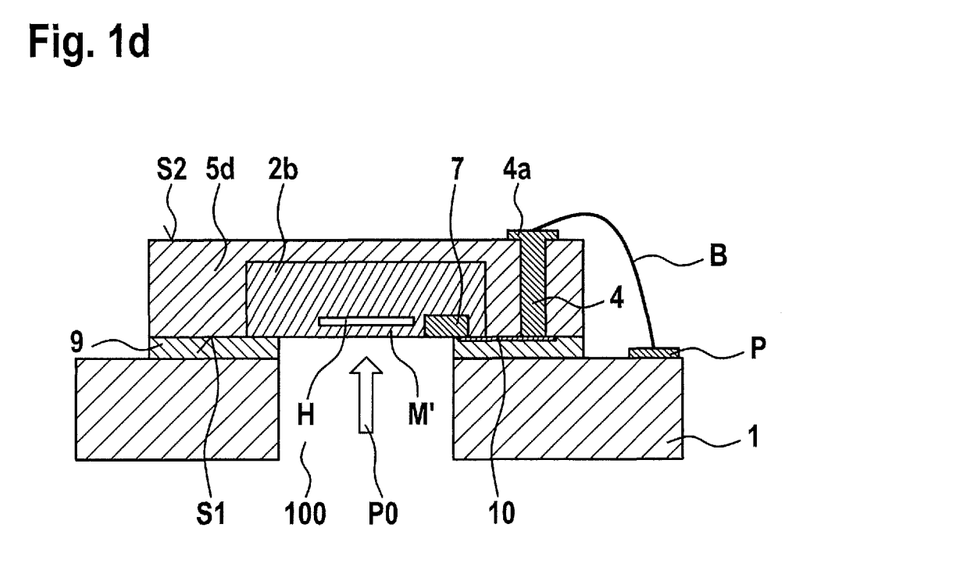

An absolute pressure sensor chip 2b is also present according to FIG. 1d, the molding housing 5d extending not only laterally, but extending higher than absolute pressure sensor chip 2b at rear side S2, and also extending over and covering the side of absolute pressure sensor chip 2b opposite diaphragm area M'.

The first through the fourth specific embodiments according to FIGS. 1a through 1d are identical in structure with respect to vias 4 and rewiring device 10. They are formed in the molding compound during the molding process. For example, connector pins may be positioned on the molded carrier, which later represent vias 4. These may be metal pins or semiconductor pins, for example. Once the molded carrier is removed, the semiconductor chips and the connector pins are exposed and may be electrically contacted via rewiring device 10.

The overlapping of the molded housing on the chip according to FIGS. 1b and 1d serves to improve sealing and to increase the pressure load capacity. The additional molded covering creates an essentially improved impermeability of interior space versus exterior space. The impermeability is not dependent on the delamination freedom of mold package 5b, 5d at the vertical chip edge.

Figure 2:
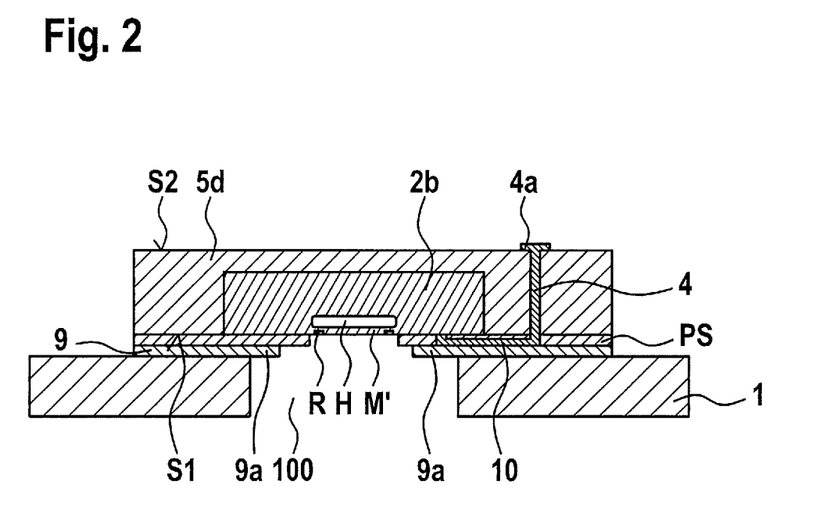
FIG. 2 schematically shows a vertical, cross-sectional representation of a micromechanical sensor system according to a fifth specific embodiment of the present invention.

FIG. 2 is a schematic, vertical representation of a micromechanical sensor system according to a fifth specific embodiment of the present invention.

The fifth specific embodiment according to FIG. 2 corresponds in principle to the specific embodiment according to FIG. 1d, rewiring device 10 being depicted in greater detail on front side S1.

In particular, an isolation layer PS is provided on front side S1, on or in which rewiring device 10 is guided. Isolation layer PS and adhesive layer 9 are drawn into the area of through-opening 100, but not as far as diaphragm area M', the conducting paths of rewiring device 10 being completely covered by adhesive layer 9. In the specific embodiment according to FIG. 2, adhesive layer 9 is retracted in area 9a with respect to underlying isolation layer PS.

Also drawn in FIG. 2 are piezoresistive resistors R, which are located in diaphragm area M', via which the pressure measurement is electrically implemented.

Figure 3:
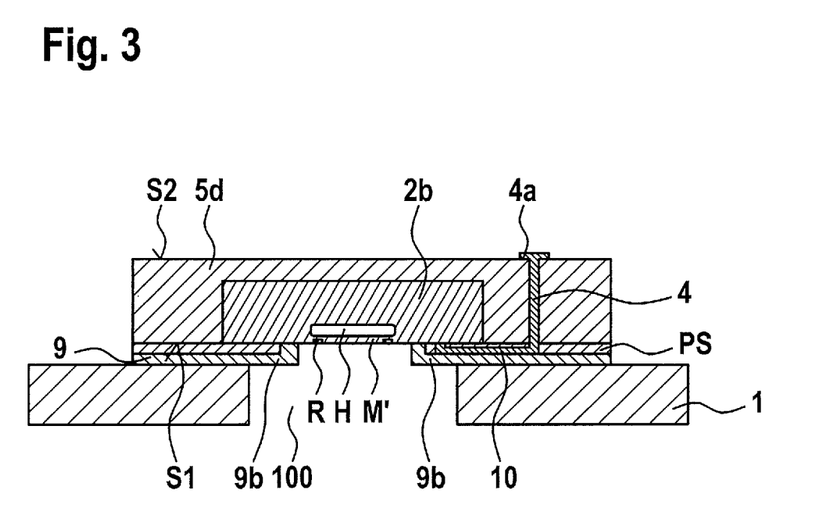
FIG. 3 schematically shows a vertical, cross-sectional representation of a micromechanical sensor system according to a sixth specific embodiment of the present invention.

FIG. 3 is a schematic, vertical cross-sectional representation of a micromechanical sensor system according to a sixth specific embodiment of the present invention.

In the sixth specific embodiment according to FIG. 3, adhesive layer 9 encapsulates the isolation layer in area 9b. The structure is otherwise the same as in the fifth specific embodiment.

Figure 4:
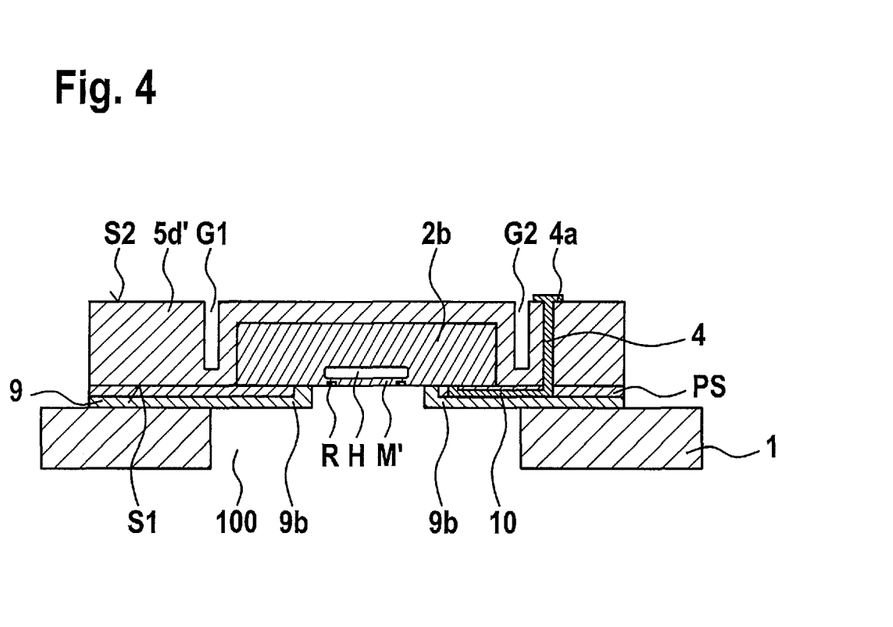
FIG. 4 schematically shows a vertical, cross-sectional representation of a micromechanical sensor system according to a seventh specific embodiment of the present invention.

FIG. 4 is a schematic, vertical, cross-sectional representation of a micromechanical sensor system according to a seventh specific embodiment of the present invention In the seventh specific embodiment according to FIG. 4, stress relief trenches G1, G2 are provided at rear side S2 in molded housing 5d', in contrast to the sixth specific embodiment according to FIG. 3. Stress relief trenches G1, G2 ensure an effective stress relief of molded housing 5d' and absolute pressure sensor chip 2b.

Figure 5:
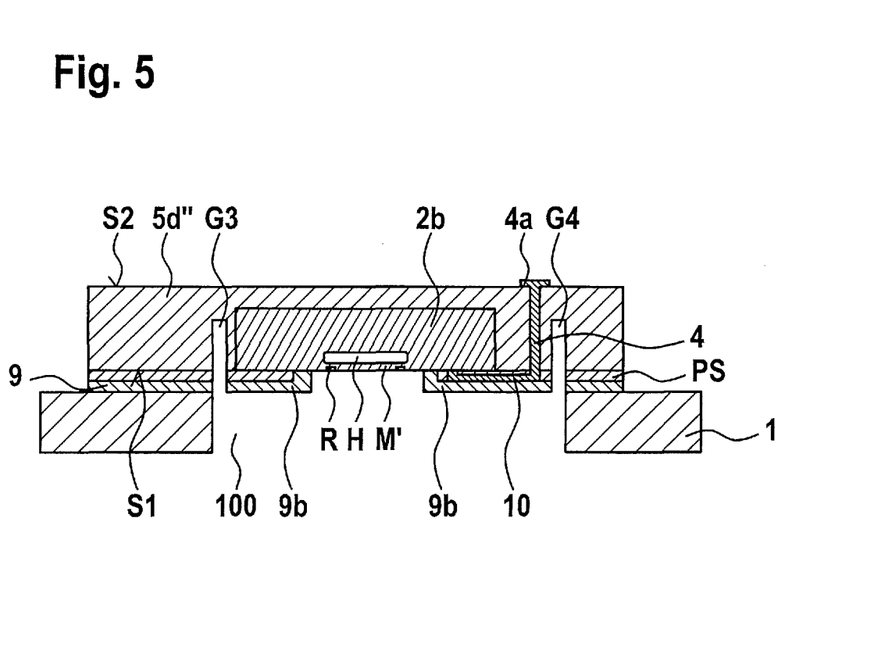
FIG. 5 schematically shows a vertical, cross-sectional representation of a micromechanical sensor system according to an eighth specific embodiment of the present invention.

FIG. 5 is a schematic, vertical, cross-sectional representation of a micromechanical sensor system according to an eighth specific embodiment of the present invention.

In the eighth specific embodiment according to FIG. 5, stress relief trenches G3, G4 are provided at front side S1 in mold package 5d". Stress relief trenches G3, G4 are situated in such a way that they do not intersect with rewiring device 10, which should be indicated by dashed lines.

It is understood that in combining the seventh and eighth specific embodiments, stress relief trenches may also be provided on front side S1 and on rear side S2.

Figure 6:
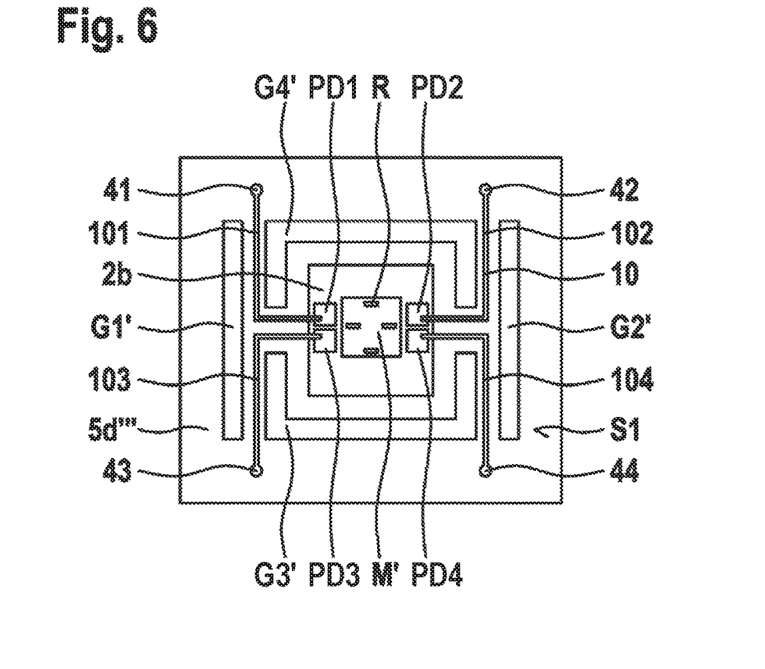
FIG. 6 schematically shows a horizontal, cross-sectional representation of a micromechanical sensor system according to a ninth specific embodiment of the present invention.

FIG. 6 is a schematic, horizontal, cross-sectional representation of a micromechanical sensor system according to a ninth specific embodiment of the present invention.

The cross-sectional representation according to FIG. 6 is oriented in the plane of the rewiring device, which in this case includes four conducting paths 101, 102, 103, 104, which extend from connecting pads PD1, PD2, PD3, PD4 on the exposed chip area next to diaphragm area M' with the piezoresistive resistors R to associated vias 41, 42, 43, 44 in molded housing 5d'''.

Micromechanical absolute pressure sensor chip 2b is largely decoupled from molded housing 5d''' by stress relief trenches G1', G2', G3', G4'. In this ninth specific embodiment, stress relief trenches G1' through G4' are introduced from front side S1 and extend on both sides of conducting paths 101 through 104, so that a maximum stress decoupling is created. Thus, conducting paths 101 through 104 extend on webs of molded housing 5d'''.

Figure 7:
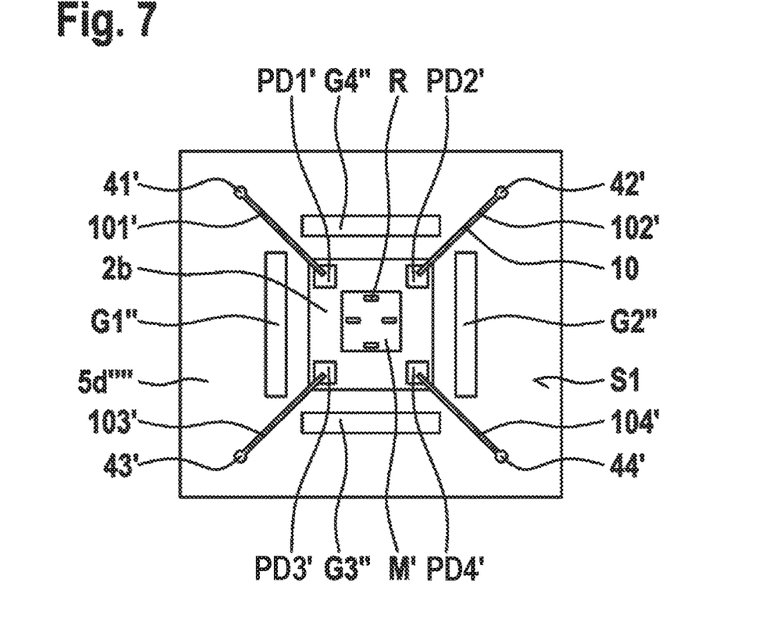
FIG. 7 schematically shows a horizontal, cross-sectional representation of a micromechanical sensor system according to a tenth specific embodiment of the present invention.

FIG. 7 is a schematic, horizontal cross-sectional representation of a micromechanical sensor system according to a tenth specific embodiment of the present invention.

The representation according to FIG. 7 corresponds to the representation according to FIG. 6, the rewiring device in this case including conducting paths 101', 102', 103', 104', which are guided from connecting pads PD1', PD2', PD3', PD4' P1', P2', P3', Pd' in the corners of the exposed chip area next to diaphragm area M' with the piezoresistive resisters R, virtually diagonally to corresponding vias 41', 42', 43', 44'.

Stress relief trenches G1", G2", G3", G4" are provided from front side S1 around the exposed chip area, excluding conducting paths 101' through 104'. An advantage of this tenth specific embodiment is that the webs of molded housing 5d''', by way of which conducting paths 101' through 104' must be guided, are located in the corners of the chip, where micromechanical absolute pressure sensor chip 2b is less affected by mechanical stress than in the middle of the chip edges, on which the piezoresistive resistors R are located.

Figure 8A:
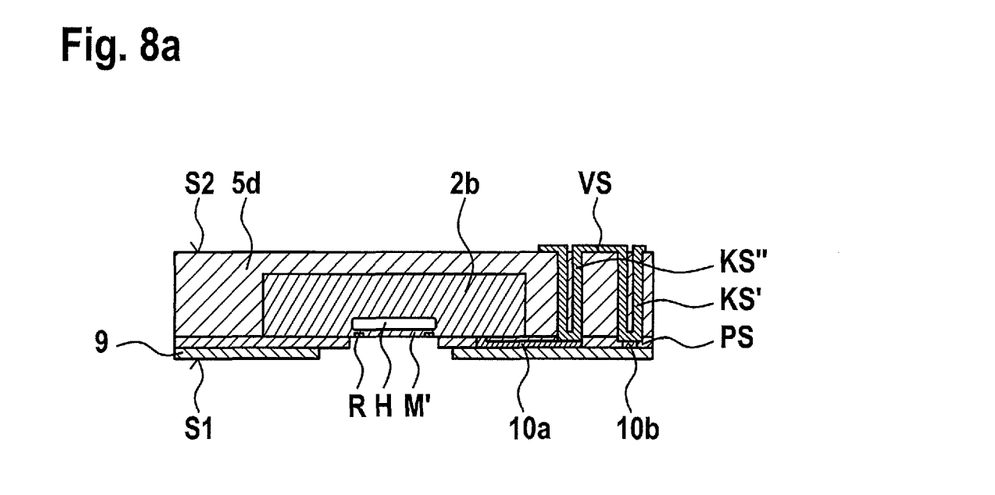
FIGS. 8a and 8b schematically show vertical, cross-sectional representations for explaining a manufacturing method of a micromechanical sensor system according to an eleventh specific embodiment of the present invention.
Figure 8B:
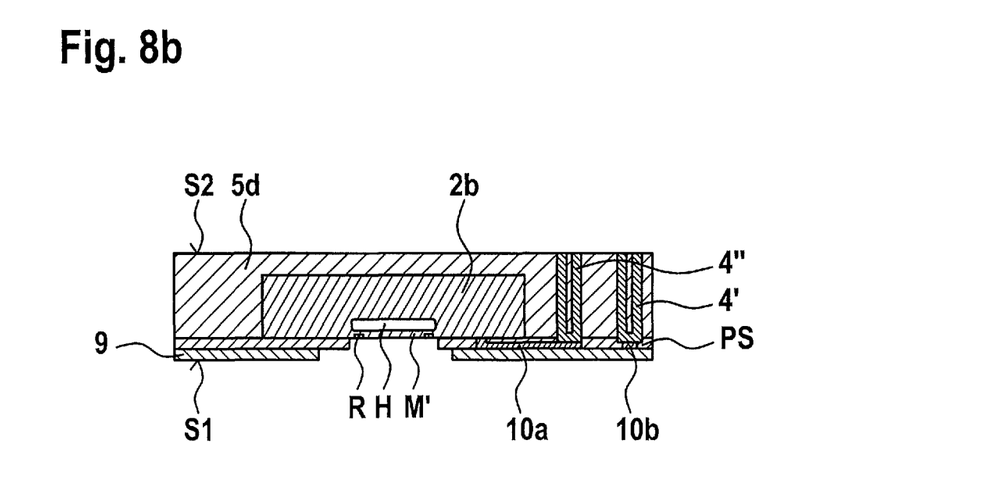

FIGS. 8a and 8b are schematic, vertical, cross-sectional representations for explaining a manufacturing method of a micromechanical sensor system according to an eleventh specific embodiment of the present invention.

The representation according to FIGS. 8a, b largely corresponds to the representation according to FIG. 2, the difference in the case of the eleventh specific embodiment according to FIG. 8a being that connector pins KS', KS" for the vias are set on the molded carrier (not shown) during molding in a frame configuration or net-like contiguous manner, so that only one single assembly operation is required. In this way, it is possible to easily produce many vias.

The connecting webs between individual contactor pins KS', KS" are indicated in FIG. 8a) with reference symbol VS. In this specific embodiment, contactor pins KS', KS" are U-shaped.

FIG. 8a represents the state immediately after the molding process and the mounting of rewiring device 10a, 10b on the rear side, both on or in isolation layer PS, as well as adhesive layer 9.

To arrive at the process state shown in FIG. 8b, a grinding process takes place on rear side S2, so that connecting webs VS are removed and only U-shaped vias 4', 4" remain, which are in contact with rewiring device 10a, 10b.

The concluding process step (not shown) is the bonding on carrier substrate 1 with the aid of adhesive layer 9.

Although connector pins KS', KS" are depicted as U-shaped in this eleventh specific embodiment, it is of course also conceivable to use simple I-shaped connector pins, which, for example, are connected by corresponding connecting pins.

The lattice-like configuration of connector pins KS', KS" may be produced by a wire-bending method such as, for example, to a lead frame in molded housings, a galvanic process or a wafer etching process.

Figure 9A:
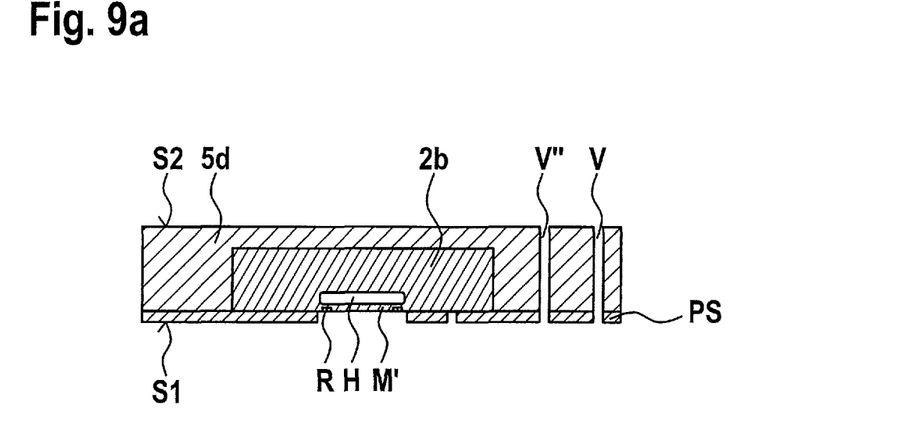
FIGS. 9a and 9b schematically show vertical, cross-sectional representations for explaining a manufacturing method of a micromechanical sensor system according to a twelfth specific embodiment of the present invention.
Figure 9B:
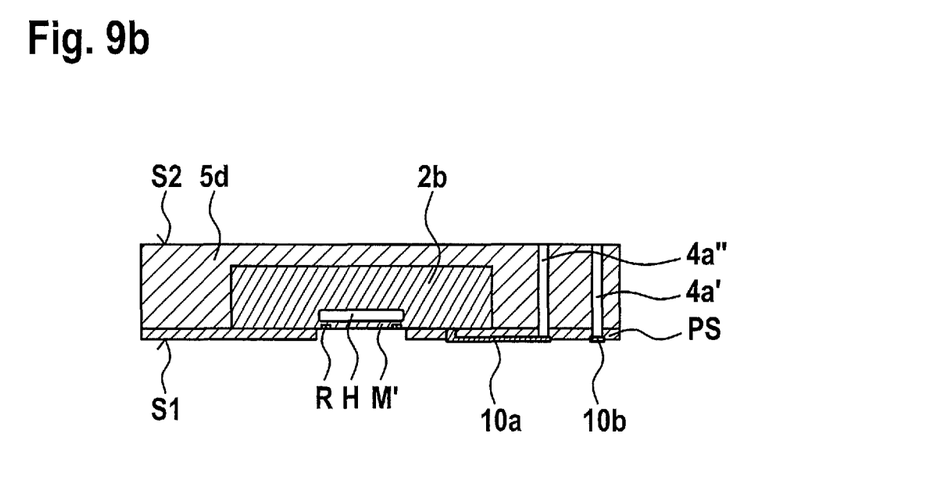

FIGS. 9a and 9b are schematic, vertical, cross-sectional representations for explaining a manufacturing method of a micromechanical sensor system according to a twelfth specific embodiment of the present invention.

In the twelfth specific embodiment according to FIGS. 9a and 9b, vias or through-holes V', V" are produced during molding, for example, by thermally or chemically removable sacrificial pins or mechanically removable stamp pins in vias V', V" during the molding process. A very simple production method is the use of a corresponding mechanical stamp for vias V', V", etc., which may be removed after the molding process. This is followed by the application and structuring of isolation layer PS on front side S1 of sensor chip 2b provided with molded housing 5d.

In a subsequent process step which is shown in FIG. 9b, vias 4a', 4a", as well as the conducting paths of rewiring device 10a, 10b are produced with the aid of a screen printing-thin film process for applying a corresponding conductive layer.

The application of adhesive layer 9 and the bonding on carrier substrate 1 take place in further process steps not shown.

Figure 10:
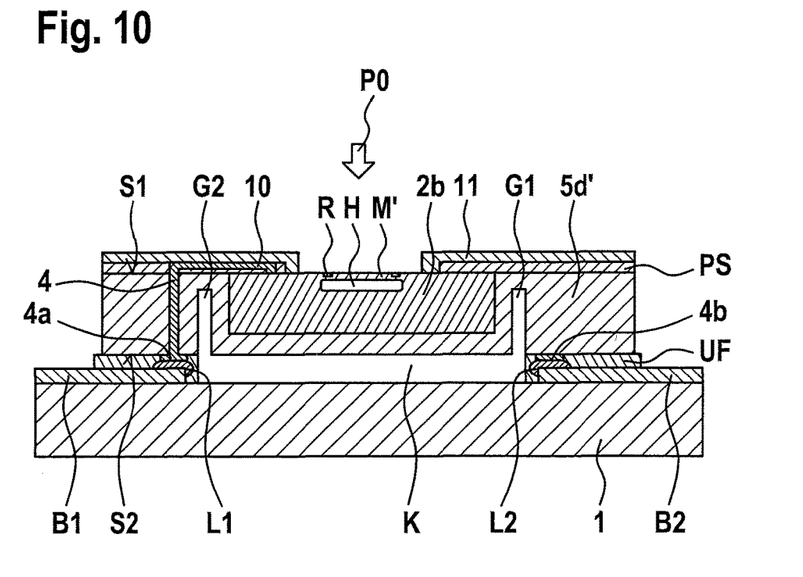
FIG. 10 schematically shows a vertical, cross-sectional representation of a micromechanical sensor system according to a thirteenth specific embodiment of the present invention.

FIG. 10 is a schematic, vertical, cross-sectional representation of a micromechanical sensor system according to a thirteenth specific embodiment of the present invention.

In the thirteenth specific embodiment according to FIG. 10, micromechanical absolute pressure sensor chip 2b surrounded with molding compound 5d' is applied according to FIG. 5 with the aid of a flip chip method, rear side S" being bonded to carrier substrate 1.

For this purpose, bonding surfaces 4a, 4b are provided on the front side which are bonded to corresponding bonding areas B1, B2 on carrier substrate 1 with the aid of soldering material L1, L2. In addition, it is also possible to provide an underfill UF in the area of the bonding sites, which contributes to stress relief.

Moreover, this specific embodiment requires no through-opening in carrier substrate 1 if an absolute pressure sensor chip 2b is fitted.

It is understood, however, that this specific embodiment as well as any other may be implemented with a differential pressure sensor chip, either a media access through a corresponding hole in carrier substrate 1 to cavern K then being created between the chip and carrier substrate 1, or a reference pressure atmosphere being enclosed therein.

Figure 11:
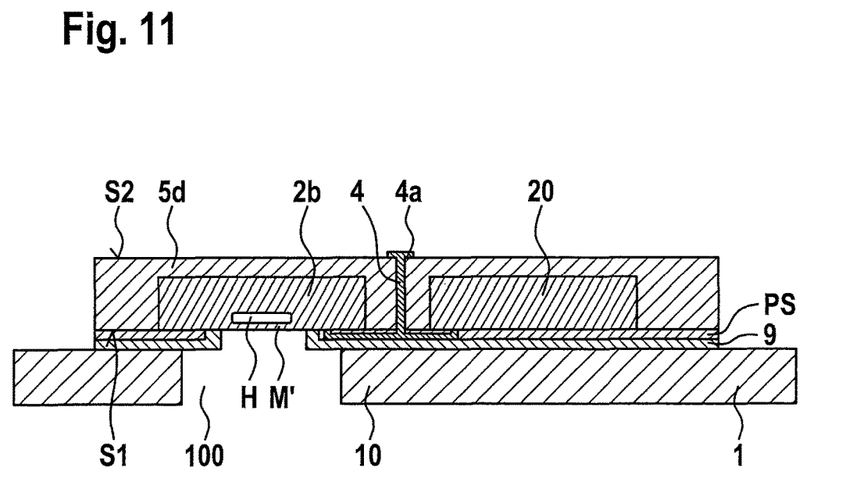
FIG. 11 schematically shows a vertical, cross-sectional representation of a micromechanical sensor system according to a fourteenth specific embodiment of the present invention.

FIG. 11 is a schematic, vertical, cross-sectional representation of a micromechanical sensor system according to a fourteenth specific embodiment of the present invention.

In the fourteenth specific embodiment, an ASIC evaluation chip 20 is also provided in molded housing 5d2 next to sensor chip 2b according to FIG. 3, and is connected to rewiring device 10.

Although the present invention has been fully described above with reference to preferred exemplary embodiments, it is not limited thereto, but may be modified in a variety of ways.

In particular, it is noted that many other possibilities for arranging the stress relief trenches with more or fewer access webs to the exposed chip are conceivable. A further nesting of the front side or rear side stress relief trenches is also conceivable.

What is claimed is:

1. A micromechanical sensor system comprising:
a micromechanical sensor chip; and
a molded housing;
wherein the molded housing is molded onto the micromechanical sensor chip to surround the micromechanical sensor chip at least laterally, the molded housing including a front side and a rear side, the micromechanical sensor chip including a chip area having an exposed diaphragm on a same side as the front side, and wherein an electrical connection is formed starting from the chip area, initially to the front side of the surrounding molded housing via a rewiring device formed on the front side, and subsequently through at least one via from the front side to the rear side of the molded housing.

2. The micromechanical sensor system as recited in claim 1, wherein the micromechanical sensor chip is affixed to a carrier substrate on one of: the rear side, or the front side.

3. The micromechanical sensor system as recited in claim 1, wherein the chip area includes at least one connecting pad.

4. The micromechanical sensor system as recited in claim 1, wherein the rewiring device is covered with a cover layer.

5. The micromechanical sensor system as recited in claim 4, wherein the cover layer is an adhesive layer.

6. The micromechanical sensor system as recited in claim 1, wherein the micromechanical sensor chip is one of a differential pressure sensor chip or an absolute pressure sensor chip.

7. The micromechanical sensor system as recited in claim 1, further comprising an evaluation chip provided in the molded housing, wherein the evaluation chip is electrically connected on the front side to the via by way of the rewiring device.

8. The micromechanical sensor system as recited in claim 1, wherein the chip area is not covered by the molded housing.

9. A micromechanical sensor system comprising:
a micromechanical sensor chip; and
a molded housing;
wherein the molded housing is molded onto the micromechanical sensor chip to surround the micromechanical sensor chip at least laterally, the molded housing including a front side and a rear side, the micromechanical sensor chip including a chip area, and wherein an electrical connection is formed starting from the chip area, initially to the front side of the surrounding molded housing via a rewiring device formed on the front side, and subsequently through at least one via from the front side to the rear side of the molded housing, and
wherein an isolation layer is provided on the front side in which the rewiring device is formed.

10. A micromechanical sensor system comprising:
a micromechanical sensor chip; and
a molded housing;
wherein the molded housing is molded onto the micromechanical sensor chip to surround the micromechanical sensor chip at least laterally, the molded housing including a front side and a rear side, the micromechanical sensor chip including a chip area, and wherein an electrical connection is formed starting from the chip area, initially to the front side of the surrounding molded housing via a rewiring device formed on the front side, and subsequently through at least one via from the front side to the rear side of the molded housing, and
wherein stress relief trenches are formed in the molded housing, starting from the front side in the periphery of the micromechanical sensor chip.

11. The micromechanical sensor system as recited in claim 10, wherein the chip area includes at least one connecting pad.

12. The micromechanical sensor system as recited in claim 10, wherein the micromechanical sensor chip is one of a differential pressure sensor chip or an absolute pressure sensor chip.

13. The micromechanical sensor system as recited in claim 10, wherein the chip area is not covered by the molded housing.

14. A micromechanical sensor system comprising:
a micromechanical sensor chip; and
a molded housing;
wherein the molded housing is molded onto the micromechanical sensor chip to surround the micromechanical sensor chip at least laterally, the molded housing including a front side and a rear side, the micromechanical sensor chip including a chip area, and wherein an electrical connection is formed starting from the chip area, initially to the front side of the surrounding molded housing via a rewiring device formed on the front side, and subsequently through at least one via from the front side to the rear side of the molded housing, and wherein stress relief trenches are formed in the molded housing, starting from the rear side in the periphery of the micromechanical sensor chip.

15. The micromechanical sensor system as recited in claim 14, wherein the chip area includes at least one connecting pad.

16. The micromechanical sensor system as recited in claim 14, wherein the micromechanical sensor chip is one of a differential pressure sensor chip or an absolute pressure sensor chip.

17. The micromechanical sensor system as recited in claim 14, wherein the chip area is not covered by the molded housing.

\* \* \* \* \*